US006933720B2

(12) United States Patent
Zhang

(10) Patent No.: US 6,933,720 B2
(45) Date of Patent: Aug. 23, 2005

(54) SEQUENCE PRECONDITIONING FOR ULTRA-FAST MAGNETIC RESONANCE IMAGING

(75) Inventor: Weiguo Zhang, Foster City, CA (US)

(73) Assignee: Toshiba America MRI, Inc., Tustin, CA (US)

( * ) Notice: Subject to any disclaimer, the term of this patent is extended or adjusted under 35 U.S.C. 154(b) by 181 days.

(21) Appl. No.: 10/012,036

(22) Filed: Dec. 11, 2001

(65) Prior Publication Data

US 2003/0109781 A1 Jun. 12, 2003

(51) Int. Cl.$^7$ ............................. G01V 3/00; A61B 5/055
(52) U.S. Cl. ....................... 324/309; 324/307; 324/312; 324/314; 600/410
(58) Field of Search ................................. 324/309, 307, 324/312, 311, 306, 314, 318; 600/410, 419

(56) References Cited

U.S. PATENT DOCUMENTS

| | | | | |
|---|---|---|---|---|
| 4,859,946 A | * | 8/1989 | Kuhara | 324/309 |
| 4,970,457 A | * | 11/1990 | Kaufman et al. | 324/309 |
| 5,138,259 A | * | 8/1992 | Schmitt et al. | 324/309 |
| RE35,656 E | | 12/1993 | Feinberg et al. | 324/309 |
| 5,493,224 A | * | 2/1996 | Shiono et al. | 324/309 |
| 5,519,320 A | | 5/1996 | Kanayama et al. | 324/309 |
| 5,602,476 A | | 2/1997 | Liu et al. | 324/309 |
| 5,621,321 A | * | 4/1997 | Liu et al. | 324/309 |
| 5,672,969 A | | 9/1997 | Zhou et al. | 324/309 |
| 5,722,409 A | | 3/1998 | Kuhara et al. | 600/410 |
| 5,726,571 A | | 3/1998 | Guclu et al. | 324/322 |
| 5,742,163 A | | 4/1998 | Liu et al. | 324/309 |
| 5,755,665 A | | 5/1998 | Takahashi et al. | 600/410 |
| 5,818,229 A | | 10/1998 | Kanazawa | 324/309 |
| 5,864,233 A | * | 1/1999 | Zhou et al. | 324/309 |
| 5,942,897 A | * | 8/1999 | Kanazawa | 324/309 |
| 5,952,827 A | | 9/1999 | Feinberg | 324/309 |
| 6,044,290 A | * | 3/2000 | Vigen et al. | 600/419 |

(Continued)

OTHER PUBLICATIONS

P. Mansfield, and I.L. Pykett, in "Biological and Medical Imaging by NMR", J. Magn. Reson. 29, 355–373 (1978).

"The k–space trajectory formulation of the NMR imaging process with applications in the analysis and synthesis of imaging methods" Med. Phys. 10, 610–621 (1983), by D.B. Twieg.

"A simple graphical representation of Fourier–based imaging methods" J. Magn. Reson. 54, 33 8–343 (1983), by S. Ljunggren.

Kensuke Sekihara. Hideki Kohno, "New Reconstruction Technique for Echo–Planar Imaging to Allow Combined Use of Odd and Even Numbered Echoes", Magn. Reson. Med. 5. 485–491 (1987).

H. Bruder, H. Fischer, H.–E. Reinfelder, F. Schmitt, "Image Reconstruction for Echo Planar Imaging with Nonequidistant k–Space Sampling", Magn. Reson. Med. 23, 311–323 (1992).

Primary Examiner—Brij Shrivastav
Assistant Examiner—Tiffany A. Fetzner
(74) Attorney, Agent, or Firm—Nixon & Vandergye P.C.

(57) ABSTRACT

An improved magnetic resonance imaging (MRI) methodology uses an abbreviated initial MRI sequence to generate sequence diagnostic parameters. The sequence diagnostic parameters have a fixed relationship to certain sequence-conditioning parameters, and are used for calculating characteristic values of the sequence-conditioning parameters. The read out gradient pulse sequence is modified in accordance with the calculated characteristic values of the sequence-conditioning parameters. The modified read out gradient pulse sequence is then incorporated into a subsequent MRI pulse sequence used for obtaining a diagnostic image. The methodology has particular application in so called ultra fast MRI process which include echo-planar imaging (EPI) and echo-volume imaging (EVI).

22 Claims, 7 Drawing Sheets

U.S. PATENT DOCUMENTS

| | | | | |
|---|---|---|---|---|
| 6,064,205 A | * | 5/2000 | Zhou et al. | 324/309 |
| 6,127,826 A | | 10/2000 | Thompson et al. | 324/307 |
| 6,134,464 A | | 10/2000 | Tan et al. | 600/410 |
| 6,188,219 B1 | * | 2/2001 | Reeder et al. | 324/307 |
| 6,239,598 B1 | | 5/2001 | Zhang | 324/309 |
| 6,239,599 B1 | * | 5/2001 | Zhou et al. | 324/309 |
| 6,252,400 B1 | | 6/2001 | Loncar et al. | 324/309 |
| 6,259,250 B1 | * | 7/2001 | Mock | 324/309 |
| 6,265,873 B1 | * | 7/2001 | Le Roux | 324/309 |
| 6,275,038 B1 | * | 8/2001 | Harvey | 324/309 |
| 6,285,187 B1 | * | 9/2001 | Mock | 324/309 |
| 6,288,545 B1 | | 9/2001 | King et al. | 324/318 |
| 6,313,629 B1 | | 11/2001 | Liu et al. | 324/309 |
| 6,323,646 B1 | * | 11/2001 | Zhou et al. | 324/309 |
| 6,529,001 B2 | * | 3/2003 | Mock | 324/309 |
| 6,541,970 B1 | * | 4/2003 | Takizawa et al. | 324/309 |
| 6,586,935 B1 | * | 7/2003 | Ma et al. | 324/312 |
| 6,700,374 B1 | * | 3/2004 | Wu et al. | 324/312 |
| 2001/0004211 A1 | | 6/2001 | Ookawa | 324/309 |
| 2001/0008376 A1 | * | 7/2001 | Mock | 324/307 |
| 2001/0038284 A1 | | 11/2001 | Hahn | 324/307 |
| 2003/0109781 A1 | * | 6/2003 | Zhang | 600/410 |

* cited by examiner

SEQUENCE PRECONDITIONING FOR ULTRA-FAST MAGNETIC RESONANCE IMAGING

FIELD OF THE INVENTION

This invention relates generally to magnetic resonance imaging (MRI) techniques. In particular, the invention relates to pulse sequence-preconditioning methods for ultra-fast MRIs so that the echo signals are amenable to post-acquisition methods being employed to correct for data imperfection and improved image quality.

BACKGROUND OF THE INVENTION

Magnetic Resonance Imaging (MRI) is a widely accepted and commercially available technique for obtaining digitized visual images representing the internal structure of objects (such as the human body) having substantial populations of atomic nuclei that are susceptible to nuclear magnetic resonance (NMR) also known as magnetic resonance (MR) phenomena. In MRI, imposing a strong main magnetic field (B0) on the nuclei polarizes nuclei in the body of a patient to be imaged. The nuclei are excited by a radio frequency (RF) signal at characteristic NMR (Larmor) frequencies. By spatially distributing localized magnetic fields surrounding the body and analyzing the resulting RF responses from the nuclei, a map or image of these nuclei responses as a function of their spatial location is generated and displayed. An image of the nuclei responses provides a non-invasive view of a patient's internal organs and of other tissues.

As shown in FIG. 1, an MRI system typically includes a magnet 10 to impose the static magnetic field ($B_0$), gradient coils 14 for imposing spatially distributed gradient magnetic fields ($G_x$, $G_y$, and $G_z$) along three orthogonal coordinates, and RF coils 15 and 16 to transmit and receive RF signals to and from the selected nuclei of the body being imaged. The patient 13 lies on a movable patient table 12 such that a portion of the patient to be imaged is moved, in three-dimensions, into an "imaging volume" 11 between the magnet and coils, which defines a field of view (FOV) of the MRI system.

To acquire MRI data, the MRI system generates magnetic gradient and RF mutation pulses via MRI pulse sequence controllers 17 and 18 under the control of programmable computer/processor 19. In addition, processor 19 controls gradient pulse amplifier 20 and RF source 26 and amplifier circuits 21 and 22. The MR signal (RF detector) circuits 22 are suitably interfaced with MR signal RF coils 16 located within the shielded MRI system gantry 9. The received MR responses are digitized by digitizer 23 and passed to processor 19 which may include an array processor or the like for image processing and suitable computer program storage media (not shown) wherein programs are stored and selectively utilized so as to control the acquisition and processing of MR signal data and to produce image displays on a CRT of control terminal 24. The MRI system control terminal 24 may include suitable keyboard switches and the like for exerting operator control over the imaging sequence controllers, 17 and 18. Images may also be recorded directly on film or on other suitable media by printing device 25.

The diagnostic MRI so generated is influenced by the selected imaging mode and imaging parameters. When the MRI is unsatisfactory or when a doctor wants to see an image from another viewpoint, another MRI is generated by adjusting the desired mode and/or selected image parameter values and then repeating the whole imaging procedure. For instance, if the contrast between two or more objects of interest shown in an MRI is not optimal, the imaging parameters for MRI must be adjusted to obtain proper contrast. Similarly, if the doctor judges that an axial picture obtained by MRI a certain portion of the head did not provide good diagnostic information, another MRI from another view point must be selected and generated.

The operator selects the desired imaging parameters before an MRI is generated. The selection of the imaging parameters determines image location, slice orientation, image quality, viewpoint and other features. It is difficult to optimally select the many imaging parameters before any image is generated. The resulting image generated from the initial parameter selections are sometimes inadequate because the selected imaging parameters are, in hindsight, less than optimal. Only by viewing an actual image does it become evident that some or all of the imaging parameter selections should be reset. However, the process of generating an MRI, resetting the imaging parameters and generating another image is excessively time consuming (e.g., several minutes), especially with diagnostic mode MRI techniques that require long scanning periods.

Accordingly, there has been a long-felt need for fast imaging systems. Echo-planar imaging (EPI) and echo-volume imaging (EVI) as described by P. Mansfield, and I. L. Pykett, in "Biological and Medical Imaging by NMR"J. Magn. Reson. 29, 355–373 (1978) are methods widely employed for ultra-fast magnetic resonance imaging. Hereinafter EPI will be collectively used for both EPI and EVI for the sake of simplicity. As is known to those skilled in the art, the gradient pulse sequence for an EPI scan comprises a train of gradient pulses of continually alternating polarity in the readout direction, and a train of brief accompanying pulses in the phase encoding direction. The EPI scan produces a corresponding train or series of gradient echoes comprising successive MRI signals.

Raw MRI data can be conveniently described in k-space. See for example "The k-space trajectory formulation of the NMR imaging process with applications in the analysis and synthesis of imaging methods" Med. Phys. 10, 610–621 (1983), by D. B. Twieg and "A simple graphical representation of Fourier-based imaging methods" J. Magn. Reson. 54, 33 8–343 (1983), by S. Ljunggren, which describe that the spatial information is encoded by varying the k-values independently along each spatial dimension. Conventional imaging sequences record one line of k-space each phase encoding step. Since one phase encoding step occurs each repetition time (TR) seconds the time required to produce an image is determined by the product of TR and the number of phase encoding steps. EPI measures all lines of k-space in a single TR period.

As shown in FIG. 2, a typical echo planar imaging sequence includes a 90° slice selective RF pulse applied at the same time as a slice selection gradient. Thereafter an initial phase encoding gradient pulse and an initial frequency encoding gradient pulse are applied for positioning the spins at the corner of k-space. There follows a 180° RF pulse and then cycled phase and frequency encoding gradient pulses for traversing k-space. During these cycled pulses the signal is recorded.

FIG. 3 shows these cycled pulses in more detail. As shown in FIG. 3, the phase-encoding gradient is followed by the frequency-encoded gradient at which time a signal is recorded. Then another phase encoding gradient is followed by the reverse polarity frequency-encoding gradient at which time a signal is recorded.

Ideally, EPI data is acquired in k-space according to an equidistant Cartesian grid with the origin properly centered along all dimensions. More specifically, the k-values are incremented uniformly along each dimension and the data are acquired with a single origin where the k-values are all zero. FIG. 4 schematically depicts an ideal Cartesian grid according to which an ideal EPI data set should be acquired. In FIG. 4, the k-space data are sampled at the k-values, which are uniformly distributed in the k-space, thus the terminology equidistant Cartesian grid.

In a conventional EPI method of MRI data acquisition, k-space data are digitized with a constant sampling rate. In such circumstances, the following conditions would have to be satisfied in order to obtain the aforementioned ideal EPI data:

(1) The readout gradient (Gro) has to remain constant during the readout of each k-space line;
(2) The echo centers have to be positioned for all k-space lines such that the origins remain the same for all data lines; and
(3) The phase-encoding gradient (Gpe) has to be off during the acquisition of each line, and the area of Gpe between the acquisitions of two consecutive lines has to remain a constant.

Though hardware performance has been significantly improved in recent years, demand for faster image data acquisition remains. It is often the case that EPI data are acquired under far less ideal conditions than those previously mentioned, with the following most commonly observed deviations:

(1) Due to non-ideal hardware performance or sometimes for safety reasons, the readout gradient (Gro) is actually time varying during the acquisition of each k-space line. As a result, the k-space data become non-uniformly spaced along the readout dimension.
(2) The k-space origins are different between the odd-echoes and the even-echoes, due to a multiple of possible reasons.
(3) A constant phase-encoding gradient is used in place of blipped gradient pulses. Consequently, the k-space lines are skewed.
(4) Within the EPI echo train, the echo-centers are drifting.

FIG. 5 shows an example of such non-ideal EPI data in k-space with the above-mentioned deviations, and with all even echoes time-reversed. The echo-centers are not at the center of the data acquisition window, there is a relative shift between the odd-echo centers and even-echo centers, and the echo centers are drifting gradually out of the acquisition window during the course of EPI readout.

There have been many data correction techniques developed for dealing with non-ideal EPI data. For example, Sekihara and Kohno described a reconstruction technique for dealing with data acquired with a constant phase-encoding gradient (See Kensuke Sekihara. Hideki Kohno, "New Reconstruction Technique for Echo-Planar Imaging to Allow Combined Use of Odd and Even Numbered Echoes", Magn. Reson. Med. 5. 485–491 (1987)). Bruder et al. developed methods for image reconstruction of k-space data with non-equidistant sampling (See H. Bruder, H. Fischer, H.-E. Reinfelder, F. Schmitt, "Image Reconstruction for Echo Planar Imaging with Nonequidistant k-Space Sampling", Magn. Reson. Med. 23, 311–323 (1992)). To correct for N/2 artifacts due to differences between odd and even echoes, many techniques have been developed for measuring and correcting the differences between the echo signals, often with additional calibration scans, see for example, U.S. Pat. Nos. 5,818,229, 5,621,321, 5,722,409.

However, in order for any post-acquisition methods such as those previously cited to be effective, the original k-space data have to be "reasonably well-positioned." For example, in order to correct for the differences between the odd and even echoes, the two groups of echoes have to be sufficiently separated. More importantly, the echo signals have to be within the acquisition window for any post-acquisition methods to make any sort of corrections. Echoes outside of the acquisition window such as the later echoes, shown in FIG. 5, can no longer be "corrected."

BRIEF SUMMARY OF THE INVENTION

The present invention is directed to methods for preconditioning an EPI sequence such that the echo signals are "reasonably well-positioned" so that post-acquisition methods can be employed effectively to correct for data imperfection and to further improve the image quality. More particularly, the present invention improves the quality of magnetic resonance images by preconditioning the MRI pulse sequence used in an ultra-fast MRI system such as EPI.

Initially a modified MRI pulse sequence without phase encoding gradients is conducted to obtain several sequence diagnostic parameters. The obtained sequence diagnostic parameters are in turn used for calculating pulse-preconditioning parameters. The calculated sequence-preconditioning parameters are then used to modify the MRI pulse sequence for obtaining diagnostic images in the EPI system.

The diagnostic parameters obtained by the preconditioned sequence include the collective deviation of the echo centers from an ideal position $\Delta$, the relative collective shift of the even-echo centers from the odd-echo centers by $\delta$, and the collective linear drift of the echo centers by an amount of $\sigma$ per echo. These diagnostic parameters have a fixed relationship to the sequence-preconditioning parameters and are therefore calculated in a straightforward way.

Once calculated, the sequence-conditioning parameters are used to modify the MRI pulse sequence used to obtain diagnostic images. More particularly, the gradient read out pulse sequence is modified in accordance with the calculated sequence-conditioning parameters and a diagnostic image is then obtained by using the MRI pulse sequence which includes the modified gradient read out pulse sequence.

BRIEF DESCRIPTION OF THE DRAWINGS

The purposes and advantages gained by the present invention will be understood by careful study of the following detailed description of the presently preferred embodiment with particular reference to the accompanying drawings.

DETAILED DESCRIPTION OF THE INVENTION

An ill-conditioned EPI sequence can be characterized by the following three diagnostic parameters: (1) A collective deviation of the echo centers from the ideal position by $\Delta$; (2) A relative collective shift of the even-echo centers from the odd-echo centers by $\delta$; and (3) A collective linear drift of the echo centers in an amount of $\sigma$ per echo. Echo-centers are measured after time reversal of all the even-echoes. Thus the echo-centers of an EPI data set can be represented by:

$$C_i = C_0 + \Delta + (i\%2)*\delta + i*\sigma$$

where $i=0,1,2,\ldots,N-1$ and stands for the index of the EPI echoes, thus odd echoes are associated with even i numbers and even echoes with odd i numbers; $C_i$ is the echo center position of $(i+1)_{th}$ echo; $C_0$ is the ideal echo center position; $(i\%2)$ return 0 for odd-echoes and 1 for even-echoes.

There can also be defined three sequence-conditioning parameters to correspond to the above-defined diagnostic parameters: (1) a mistuning of the first EPI echo by the amount of $\Delta M$ in gradient moment which has the unit of gauss·ms·cm$^{-1}$; (2) a delay of the gradient waveform by an amount of d; and (3) an offset of the readout gradient by the amount of $g_0$.

The sequence-conditioning parameters and the diagnostic parameters are related according to:

$$\Delta M = \int_0^\Delta \gamma G_{ro}(t) dt$$

$$d = -\frac{\delta}{2}$$

$$g_0 = -\frac{\int_0^\sigma G_{ro}(t)dt}{\Delta TE}$$

where $\Delta TE$ is the time interval between two consecutive EPI echoes.

Therefore, the sequence-conditioning parameters can be determined from the diagnostic parameters and used to precondition the imaging sequence so that the EPI echoes are optimally positioned for application of whatever post-acquisition methods are prescribed for data correction.

Data used for measurement of the diagnostic parameters are acquired using the same EPI sequence for imaging, except the phase-encoding gradients are turned off. First, all the even echoes are time reversed. The centers of the echo signals are then determined by peak searching algorithm such as by simply searching for maximum amplitude or in combination with cubic spline interpolation. The echo centers are fit to two separate lines: one for all odd echoes and another for all even echoes:

$$C_i^{odd} = a_{odd} \times i + b_{odd} \quad i=0,2,4,\ldots$$

$$C_i^{even} = a_{even} \times i + b_{even} \quad i=1,3,5,\ldots$$

The diagnostic parameters are obtained according to:

$$\Delta = \frac{b_{odd} + b_{even}}{2}$$

$$\delta = b_{even} - b_{odd}$$

$$\sigma = \frac{a_{odd} + a_{even}}{2}$$

The EPI imaging sequence is fine-tuned according to the sequence-conditioning parameters obtained from the diagnostic parameters previously measured.

Figure 1:
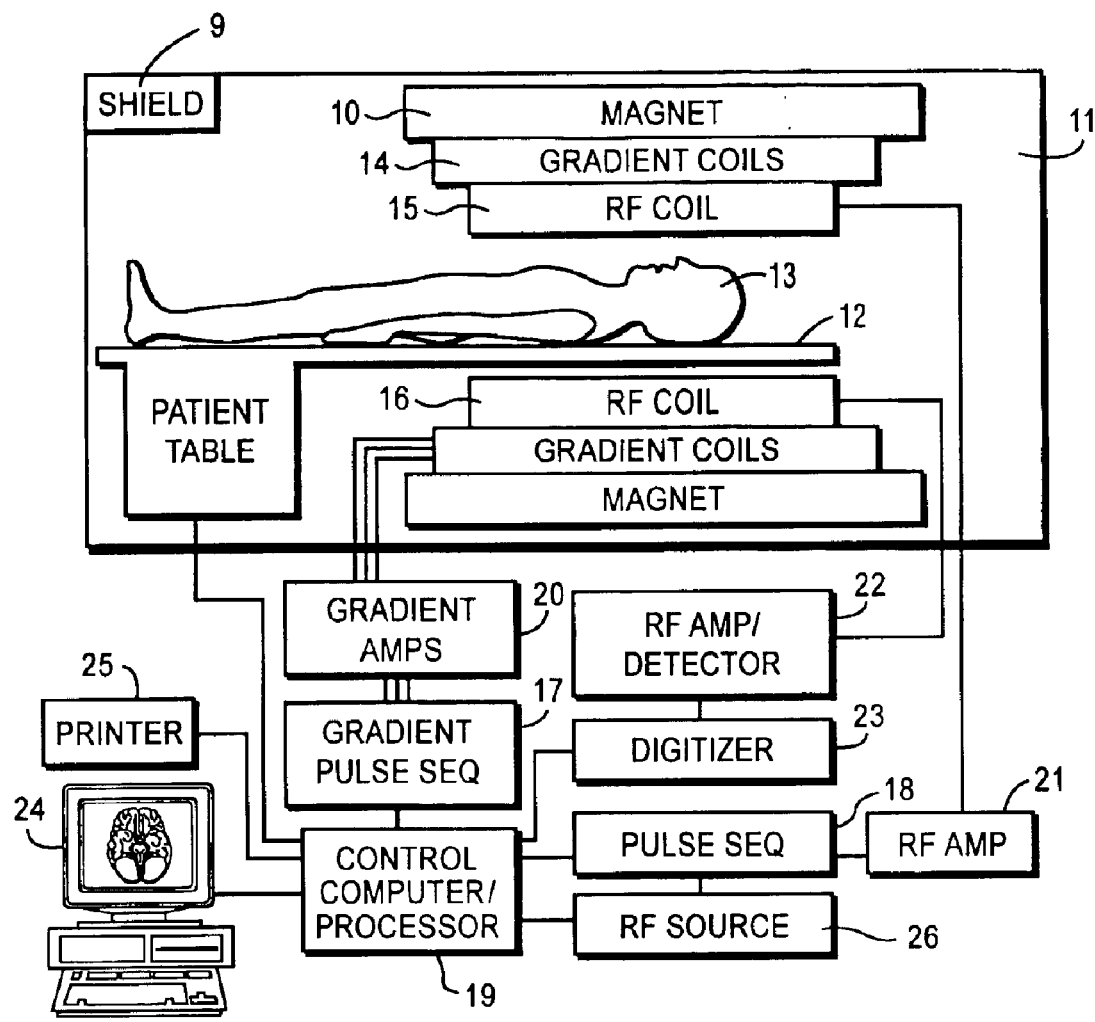
FIG. 1 is a schematic diagram of an MRI system.
Figure 2:
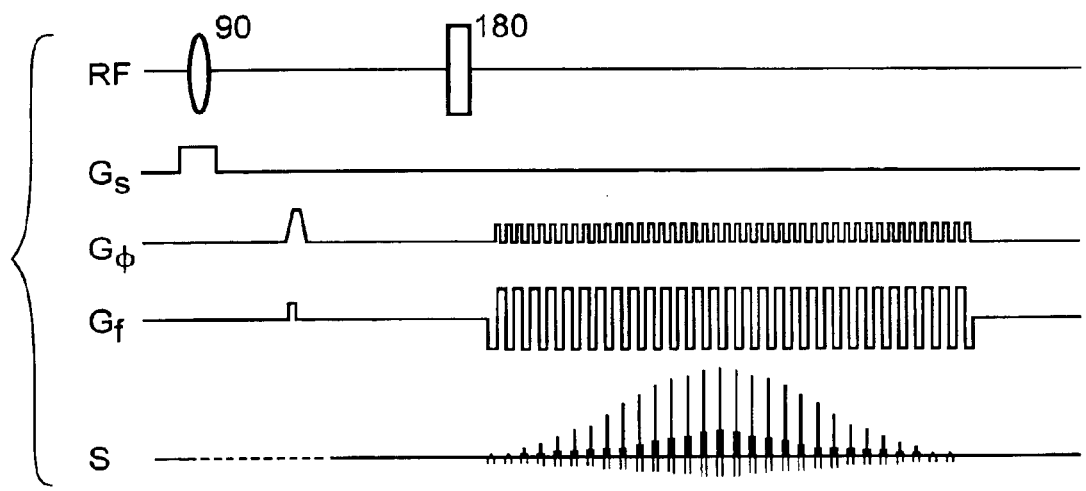
FIG. 2 shows a typical EPI pulse sequence.
Figure 3:
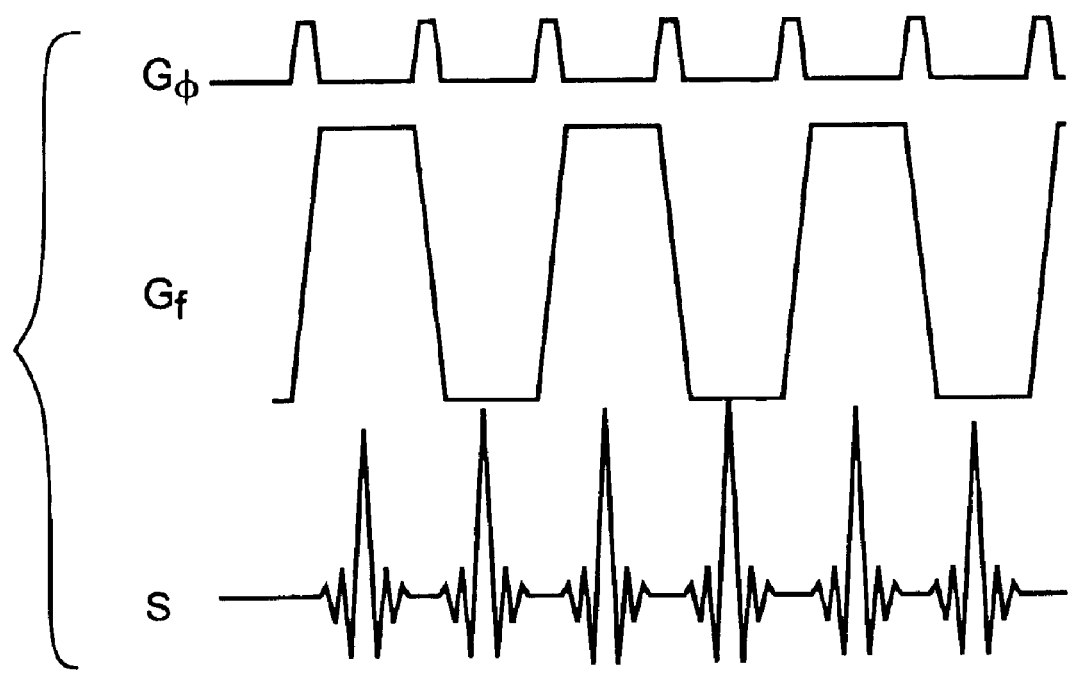
FIG. 3 shows a portion of the EPI pulse sequence of FIG. 2 in expanded detail.
Figure 4:
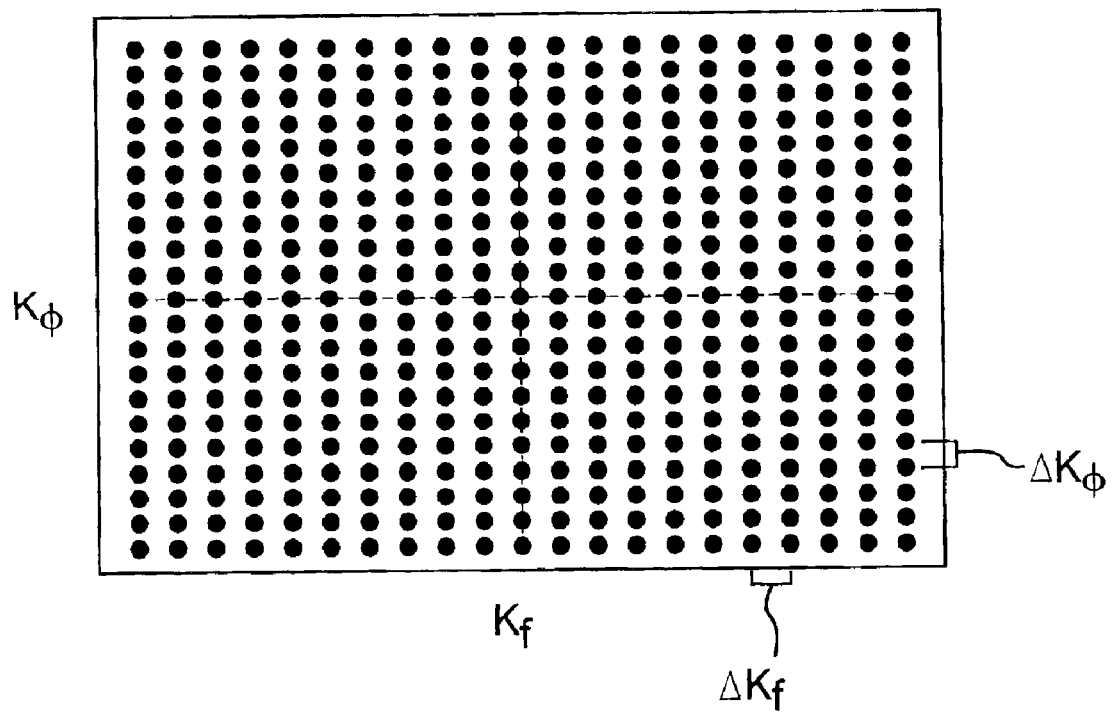
FIG. 4 schematically depicts an ideal Cartesian grid.
Figure 5:
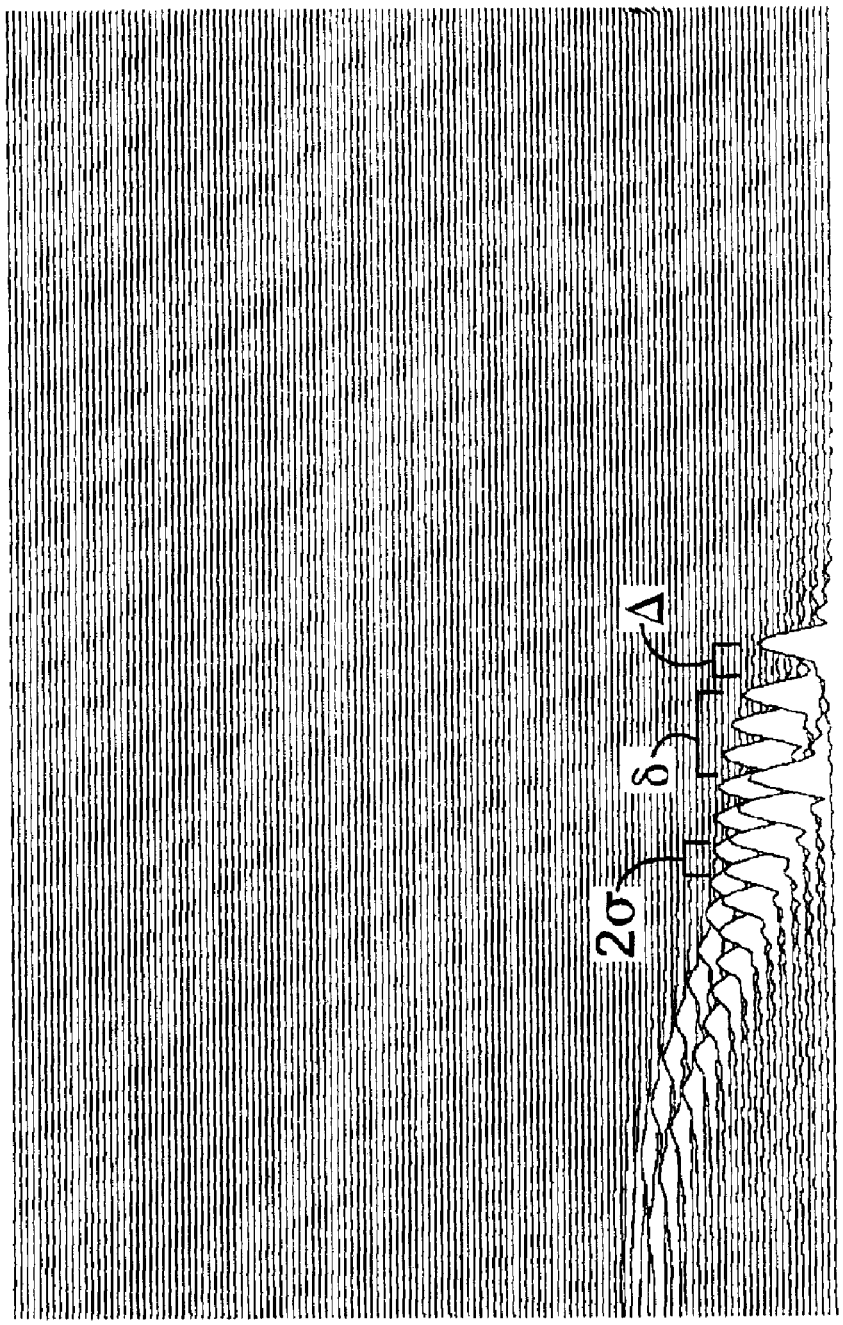
FIG. 5 shows an example of non-ideal EPI data in k-space having certain deviations.
Figure 6A:
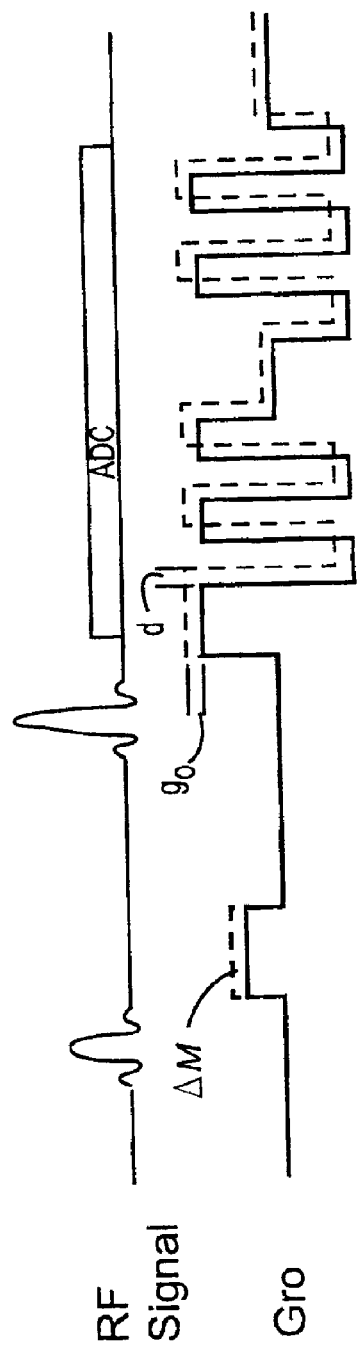
FIG. 6A shows timing diagrams of the RF and readout gradient pulses for spin-echo EPI acquisitions.
Figure 6B:
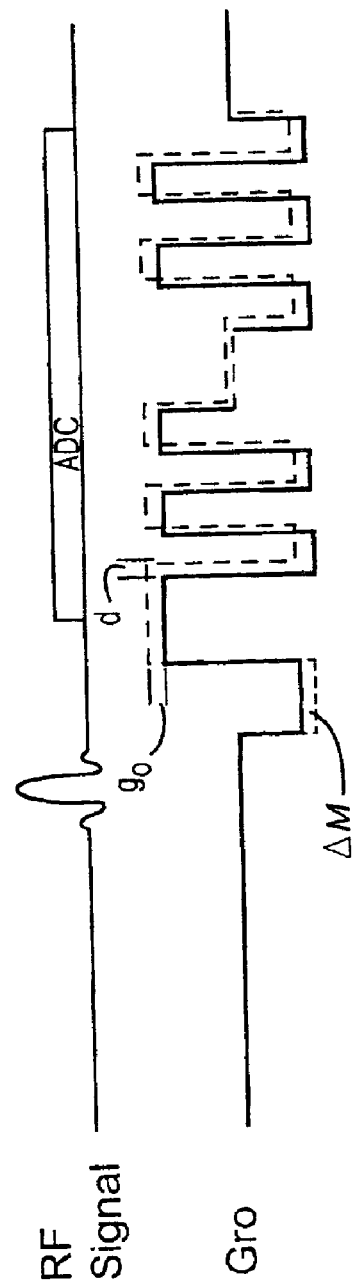
FIG. 6B shows timing diagrams of the RF and readout gradient pulses for field-echo EPI acquisitions.

Shown in FIGS. 6A and 6B are timing diagrams of the RF and readout gradient pulses for spin-echo EPI and field-echo EPI acquisitions. Other parts of the sequence are not shown since the preconditioning process does not affect them. Solid lines and dashed lines are readout gradient pulses prior and after the preconditioning, respectively. Also shown are the sequence-conditioning parameters according to which the imaging sequence is preconditioned. More specifically, the sequence-conditioning parameters $\Delta M$, $g_0$ and d, which are calculated from the diagnostic parameters, as previously discussed, are used for preconditioning the pulse sequence.

Figure 7A:
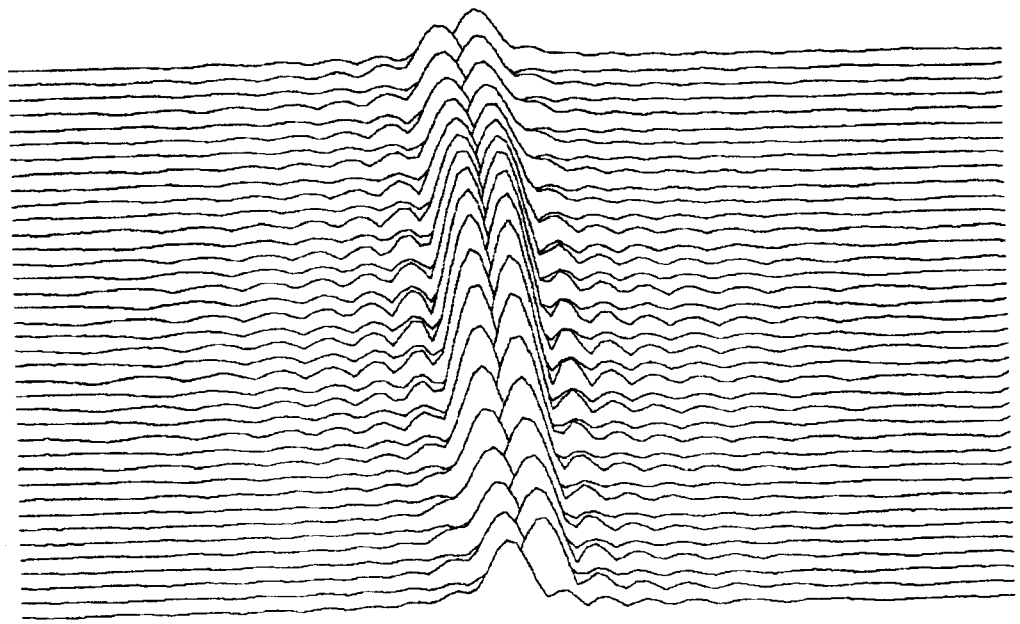
FIG. 7A shows a data set before preconditioning.
Figure 7B:
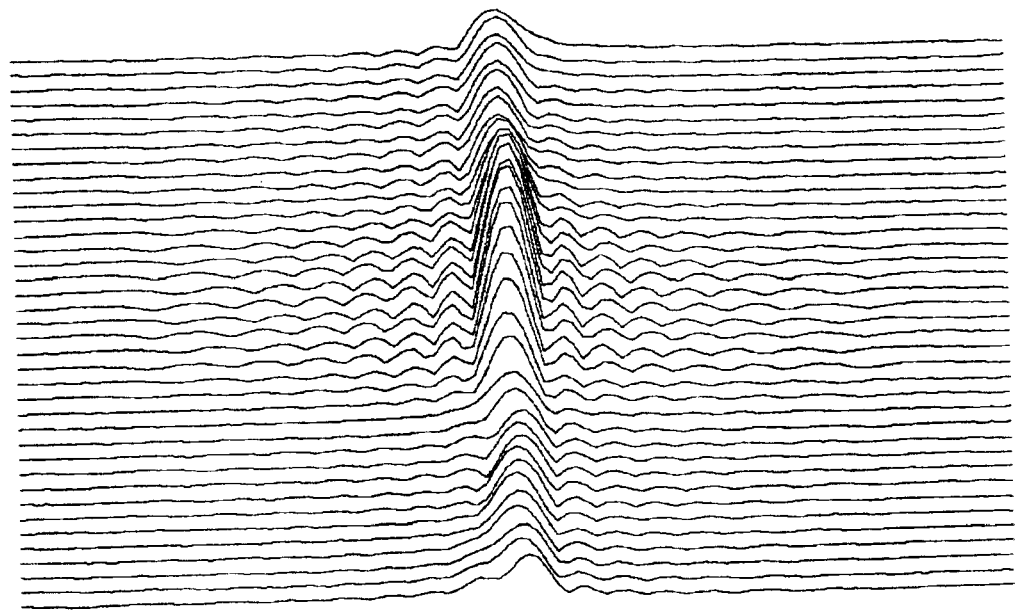
FIG. 7B shows the same data set as FIG. 7A after preconditioning.

FIGS. 7A and 7B show before and after preconditioning of echo signals from two spin-echo EPI data sets. FIG. 7A shows the data set before preconditioning, and FIG. 7B shows the data set after preconditioning with $g_0$ determined from the diagnostic parameters previously described. More particularly, FIG. 7A shows the echo signals from a spin-echo EPI sequence without phase-encoding before sequence preconditioning; and FIG. 7B shows the echo signals from the same sequence after preconditioning with $g_0$. The positioning of the echo signals is clearly shown to be improved by the preconditioning process.

The most significant advantages of the present method are that the parameters required by the preconditioning process are determined by using the same EPI sequence, and the preconditioning process can be implemented straightforwardly without any additional hardware or complex algorithm. The algorithm of the preconditioning process is easy to implement and the effectiveness of the process can be self-checked from the diagnostic parameters of a follow-up preconditioning process.

The preconditioning parameters can be recorded to reflect the system characteristics and the record can be updated and accumulated whenever a new preconditioning process is performed. Parameters from the record can also be used to initialize a new preconditioning process.

The preconditioning process can be performed either as part of the prescan of an EPI scan or as part of the quality control process.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of improving the quality of magnetic resonance images by preconditioning an EPI pulse sequence for use in an ultra-fast MRI system so as to negate abnormalities in gradient fields, said method comprising:

(i) performing a modified EPI pulse sequence with the ultra-fast MRI system with phase encoding gradients switched off thereby obtaining collective sequence diagnostic parameters, said collective sequence diagnostic parameters comprising at least one of: a collective deviation of the echo centers, from the center of the echo acquisition window by $\Delta$, a collective shift of the even-echo centers from the odd-echo centers by $\delta$; and a collective linear drift of the echo centers by an amount of $\sigma$ per echo;

(ii) computing sequence-preconditioning parameters for the EPI sequence from said obtained collective sequence diagnostic parameters; and (iii) modifying a subsequently performed EPI pulse sequence in accordance with said computed preconditioning parameters as the subsequent EPI pulse sequence is performed and thereby obtaining an improved magnetic resonance image when the subsequent EPI pulse sequence is performed.

2. The method of claim 1, wherein said collective sequence diagnostic parameters are being obtained by determining the centers of each of the echo signals, fitting the echo centers to two separate lines—one for all odd echoes and another for all even echoes $$C_i^{odd} = a_{odd} \times i + b_{odd} \quad i=0,2,4,\ldots$$

$$C_i^{even} = a_{even} \times i + b_{even} \quad i=1,3,5,\ldots$$

and computing at least one of said collective diagnostic parameters in accordance with the following $$\Delta = \frac{b_{odd} + b_{even}}{2}$$

$$\delta = b_{even} - b_{odd}$$

$$\sigma = \frac{a_{odd} + a_{even}}{2}.$$

3. The method of claim 2 wherein said computing process includes at least one of:
(a) computing a mistuning of a first echo by an amount of $\Delta M$ in gradient moment which has units of gauss·ms·cm$^{-1}$; (b) computing a delay of a gradient waveform by an amount d; and (c) computing an offset of a readout gradient by an amount of $g_0$, wherein $$\Delta M = \int_0^{\Delta} \gamma G_{ro}(t) dt$$

$$d = -\frac{\delta}{2}$$

$$g_0 = -\frac{\int_0^{\sigma} G_{ro}(t) dt}{\Delta TE}$$

where $\Delta TE$ is a time interval between two consecutive echoes.

4. The method of claim 1 wherein said modifying process involves modifying a gradient read out pulse sequence of the EPI pulse sequence.

5. The method of claim 1, said EPI pulse sequence being used in an echo-planar imaging process.

6. The method of claim 1, said EPI pulse sequence being used in an echo-volume imaging process.

7. An apparatus improving the quality of magnetic resonance images by preconditioning an EPI pulse sequence in an ultra-fast MRI system so as to negate abnormalities in gradient fields, said apparatus comprising:
sequence diagnostic means for obtaining a modified EPI pulse sequence with the ultra-fast MRI system with phase encoding gradients switched off thereby obtaining collective sequence diagnostic parameters, said collective sequence diagnostic parameters comprising at least one of: a collective deviation of the echo centers from the center of the echo acquisition window by $\Delta$, a collective shift of the even-echo centers from the odd-echo centers by $\delta$; and a collective linear drift of the echo centers by an amount of a per echo;
computing means for computing sequence-preconditioning parameters for the EPI sequence from said obtained collective sequence diagnostic parameters; and
imaging means for modifying the EPI pulse sequence in accordance with said computed preconditioning parameters as the subsequent EPI pulse sequence is performed and thereby obtaining an improved magnetic resonance image when the subsequent EPI pulse sequence is performed.

8. The apparatus of claim 7, wherein said collective sequence diagnostic parameters are being obtained by determining the centers of each of the echo signals, fitting the echo centers to two separate lines—one for all odd echoes and another for all even echoes $$C_i^{odd} = a_{odd} \times i + b_{odd} \quad i=0,2,4,\ldots$$

$$C_i^{even} = a_{even} \times i + b_{even} \quad i=1,3,5,\ldots$$

and computing at least one of said collective diagnostic parameters in accordance with the following $$\Delta = \frac{b_{odd} + b_{even}}{2}$$

$$\delta = b_{even} - b_{odd}$$

$$\sigma = \frac{a_{odd} + a_{even}}{2}.$$

9. The apparatus of claim 8 wherein said computing means computes at least one of:
(a) computing a mistuning of a first echo by an amount of $\Delta M$ in gradient moment which has units of gauss·ms·cm$^{-1}$; (b) computing a delay of a gradient waveform by an amount d; and (c) computing an offset of a readout gradient by an amount of $g_0$, wherein $$\Delta M = \int_0^{\Delta} \gamma G_{ro}(t) dt$$

$$d = -\frac{\delta}{2}$$

$$g_0 = -\frac{\int_0^{\sigma} G_{ro}(t) dt}{\Delta TE}$$

where $\Delta TE$ is a time interval between two consecutive echoes.

10. The apparatus of claim 7 wherein said imaging means modifies a gradient read out pulse sequence of the EPI pulse sequence.

11. The apparatus of claim 7, said apparatus being used in an echo-planar imaging system.

12. The apparatus of claim 7, said apparatus being used in an echo-volume imaging system.

13. A method of improving the quality of magnetic resonance images by preconditioning an EPI pulse sequence for use in an ultra-fast MRI system so as to negate abnormalities in gradient fields, said method comprising:
(i) performing a modified EPI pulse sequence with the ultra-fast MRI system with phase encoding gradients switched off thereby obtaining collective sequence diagnostic parameters, said collective sequence diagnostic parameters being obtained by determining the centers of each of the echo signals, fitting the echo centers to two separate lines—one for all odd echoes and another for all even echoes $$C_i^{odd} = a_{odd} \times i + b_{odd} \quad i=0,2,4,\ldots$$

$$C_i^{even} = a_{even} \times i + b_{even} \quad i=1,3,5,\ldots$$

and computing at least one of said collective diagnostic parameters in accordance with the following $$\Delta = \frac{b_{odd} + b_{even}}{2}$$

$$\delta = b_{even} - b_{odd}$$

$$\sigma = \frac{a_{odd} + a_{even}}{2};$$

(ii) computing sequence-preconditioning parameters for the EPI sequence from said obtained sequence diagnostic parameters; and (iii) modifying a subsequently performed EPI pulse sequence in accordance with said computed preconditioning parameters as the subsequent EPI pulse sequence is performed and thereby obtaining an improved magnetic resonance image when the subsequent EPI pulse sequence is performed.

14. The method of claim 13 wherein said computing process includes at least one of:

(a) computing a mistuning of a first echo by an amount of $\Delta M$ in gradient moment which has units of gauss·ms·cm$^{-1}$; (b) computing a delay of a gradient waveform by an amount d; and (c) computing an offset of a readout gradient by an amount of $g_0$, wherein $$\Delta M = \int_0^\Delta \gamma G_{ro}(t)dt$$

$$d = -\frac{\delta}{2}$$

$$g_0 = -\frac{\int_0^\sigma G_{ro}(t)dt}{\Delta TE}$$

where $\Delta TE$ is a time interval between two consecutive echoes.

15. The method of claim 13 wherein said modifying process involves modifying a gradient read out pulse sequence of the EPI pulse sequence.

16. The method of claim 13, said EPI pulse sequence being used in an echo-planar imaging process.

17. The method of claim 13, said EPI pulse sequence being used in an echo-volume imaging process.

18. An apparatus improving the quality of magnetic resonance images by preconditioning an EPI pulse sequence in an ultra-fast MRI system so as to negate abnormalities in gradient fields, said apparatus comprising:

sequence diagnostic means for obtaining a modified EPI pulse sequence with the ultra-fast MRI system with phase encoding gradients switched off thereby obtaining collective sequence diagnostic parameters, said collective sequence diagnostic parameters being obtained by determining the centers of each of the echo signals, fitting the echo centers to two separate lines—one for all odd echoes and another for all even echoes $$C_i^{odd} = a_{odd} \times i + b_{odd} \, i = 0, 2, 4, \ldots$$

$$C_i^{even} = a_{even} \times i + b_{even} \, i = 1, 3, 5, \ldots$$

and computing at least one of said collective diagnostic parameters in accordance with the following $$\Delta = \frac{b_{odd} + b_{even}}{2}$$

$$\delta = b_{even} - b_{odd}$$

$$\sigma = \frac{a_{odd} + a_{even}}{2};$$

computing means for computing sequence-preconditioning parameters of the EPI sequence from said obtained collective sequence diagnostic parameters; and imaging means for modifying the EPI pulse sequence in accordance with said computed preconditioning parameters as the subsequent EPI pulse sequence is performed and thereby obtaining an improved magnetic resonance image when the subsequent EPI pulse sequence is performed.

19. The apparatus of claim 18 wherein said computing means computes at least one of:

(a) computing a mistuning of a first echo by an amount of $\Delta M$ in gradient moment which has units of gauss·ms·cm$^{-1}$; (b) computing a delay of a gradient waveform by an amount d; and (c) computing an offset of a readout gradient by an amount of $g_0$, wherein $$\Delta M = \int_0^\Delta \gamma G_{ro}(t)dt$$

$$d = -\frac{\delta}{2}$$

$$g_0 = -\frac{\int_0^\sigma G_{ro}(t)dt}{\Delta TE}$$

where $\Delta TE$ is a time interval between two consecutive echoes.

20. The apparatus of claim 18 wherein said imaging means modifies a gradient read out pulse sequence of the EPI pulse sequence.

21. The apparatus of claim 18, said apparatus being used in an echo-planar imaging system.

22. The apparatus of claim 18, said apparatus being used in an echo-volume imaging system.

* * * * *